United States Patent

Beltran et al.

[11] Patent Number: 5,820,038
[45] Date of Patent: Oct. 13, 1998

[54] COATER TRACK DISPENSE ARM

[75] Inventors: Paul Beltran, Austin; David L. Reed, Cedar Creek, both of Tex.

[73] Assignee: Advanced Micro Devices, Inc.

[21] Appl. No.: 738,692

[22] Filed: Oct. 28, 1996

[51] Int. Cl.[6] .................................................. B05B 3/18
[52] U.S. Cl. ............................................ 239/750; 239/753
[58] Field of Search .................................. 239/750, 753, 239/282, 455, 536; 414/918; 901/43

[56] References Cited

U.S. PATENT DOCUMENTS

| | | | |
|---|---|---|---|
| 2,857,921 | 10/1958 | Hurst | 239/750 |
| 5,029,755 | 7/1991 | Schmidt et al. | 239/1 |
| 5,065,942 | 11/1991 | Shannon | 239/282 |
| 5,348,234 | 9/1994 | v. d. Woude | 239/753 |

*Primary Examiner*—Andres Kashnikow
*Assistant Examiner*—David Deal
*Attorney, Agent, or Firm*—Kevin L. Daffer; Conley, Rose & Tayon

[57] ABSTRACT

An apparatus for dispensing a photoresist solution onto a semiconductor wafer. The apparatus may include a base that attaches a dispense arm to a track. A receiver may be connected to a distal end of the arm and a nozzle may extend through an aperture in the receiver. The arm may move along the track while dispensing photoresist solution through the nozzle onto a wafer. The arm may include a pivotal connector to allow a distal end of the arm to be raised to facilitate cleaning of the apparatus.

18 Claims, 3 Drawing Sheets

COATER TRACK DISPENSE ARM

BACKGROUND OF THE INVENTION

1. Field of the Invention

The present invention generally relates to an apparatus for applying a coating material to a semiconductor wafer. An embodiment of the invention is an easily-cleanable dispensing apparatus adapted to uniformly apply a photoresist solution to a wafer through a nozzle maintained at a selected distance from the wafer.

2. Background of the Invention

The processing of a silicon wafer typically includes a coating step in which a photoresist solution is applied to the wafer. The purpose of the coating step is to apply a uniform polymeric film of a selected thickness onto the wafer. The film should adhere to the wafer and be free of defects (e.g., air bubbles, particles, etc.). "Spin coating" is a commonly-used technique that involves dispensing the photoresist solution onto the wafer and rapidly spinning the wafer. Spinning the wafer serves to dry the photoresist into a solid or gel layer having the desired film thickness. The dispensing step is typically performed by distributing photoresist solution over the entire wafer before the wafer is spun (static dispense) or by applying a small quantity of solution near the center of the wafer while spinning the wafer to distribute the solution (dynamic dispense). During the dispensing step, it is desired to distribute the solution uniformly onto the wafer to allow the formation of a coat of uniform thickness during the spin step. The dispensing apparatus should be maintained at a pre-defined, relatively close distance from the wafer to prevent splashing of the solution.

SUMMARY OF THE INVENTION

The present invention is directed to an apparatus for dispensing a composition onto a wafer. More particularly, one embodiment of the invention relates to an apparatus that includes a dispense arm for dispensing photoresist solution onto a wafer. A receiver having an aperture may be connected to the arm proximate a distal end of the arm. A nozzle is preferably engaged within the receiver such that a dispensing end of the nozzle extends through the aperture of the receiver and beyond a bottom surface of the receiver. A photoresist source may supply photoresist solution through tubing to a receiving end of the nozzle. The arm may include an envelop within which the tubing is fixably secured. The arm may be attached to a base that is adapted to move along a track. The dispense arm preferably dispenses photoresist solution through the nozzle onto a wafer spinning in a chuck while the dispense arm moves along the length of the track.

Another embodiment of the invention relates to a nozzle that includes a ridge between the receiving end of the nozzle and the dispensing end of the nozzle. The ridge preferably limits the extent to which the nozzle may be positioned within an aperture of a receiver. The ridge may engage a top surface of the receiver and facilitate the positioning of the nozzle within the aperture of the receiver such that an outlet of the dispensing end of the nozzle is maintained at a selected distance beyond a bottom surface of the receiver.

Another embodiment of the invention relates to a dispense arm, receiver, and nozzle that are constructed of stainless steel and electropolished. The surface finish roughnesses of the dispense arm, receiver, and nozzle are preferably smoother than about 35 microinches as measured by the root mean square roughness scale to inhibit the accumulation of contaminants on the surfaces of the above-mentioned components.

Another embodiment of the invention relates to an arm having a frontal member, a distal member, and a connector to pivotally connect the frontal member and the distal member. The pivotal connection preferably enables the distal member to move relative to the frontal member along a substantially vertical axis. The frontal member and the distal member each may have a protrusion such that a spring may be extended from the protrusion of the frontal member to the protrusion of the distal member. The spring is preferably adapted to stretch as the distal member is pivoted. The spring may tend to hold the distal member in a pivoted position.

The above-mentioned embodiments may be used in combination with one another.

One advantage of the invention relates to a self-positioning nozzle of a dispensing apparatus that can be removed from a receiver and then easily repositioned within the receiver at a selected distance from a wafer.

Another advantage of the invention relates to a dispensing arm that has a distal member that can be pivoted to facilitate cleaning of the apparatus.

Yet another advantage of the invention relates to dispensing apparatus components that are sufficiently smooth to inhibit the accumulation of contaminants on the surfaces of the components.

DESCRIPTION OF THE DRAWINGS

Further advantages of the present invention will become apparent to those skilled in the art with the benefit of the following detailed description of the preferred embodiments and upon reference to the accompanying drawings in which.

Figure 1:
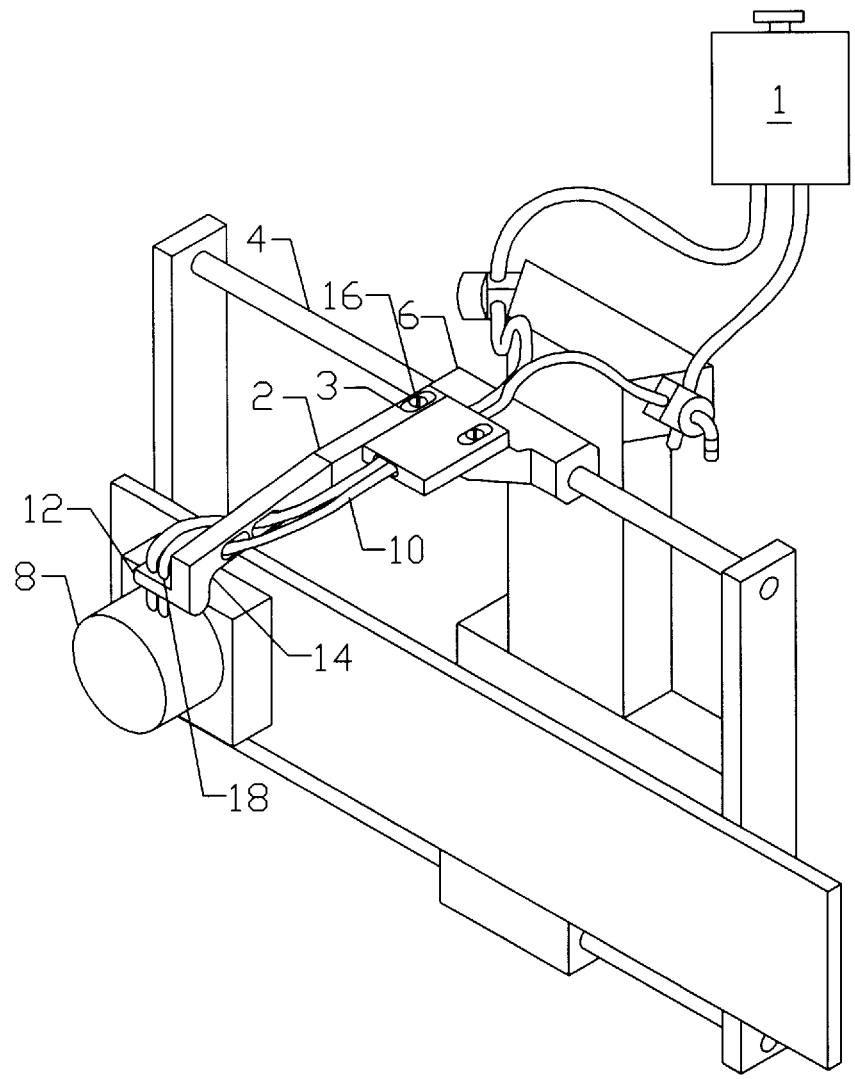
FIG. 1 depicts an embodiment of an assembled dispensing apparatus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENTS

An embodiment of a dispensing system is shown in FIG. 1. The dispensing system may include a dispense arm 2 having frontal end 16 and distal end 14. The dispense arm 2 is preferably connected to base 6 by a connector extending through aperture 3 at a location proximate the frontal end 16 of the arm. A receiver 12 may be connected to the arm proximate the distal end 14 of the arm. Receiver 12 may extend from arm 2 in a direction substantially perpendicular to the arm as shown in FIG. 1. Tubing 10 may extend through an aperture in receiver 12. Although two sections of tubing 10 are illustrated extending through receiver 12 in FIG. 1, it is to be understood that receiver 12 may have a single aperture and/or a single section of tubing extending through an aperture. The tubing is adapted to supply a composition (e.g., photoresist) from a source to a semiconductor wafer. A chuck (not shown) may support the wafer beneath receiver 12 such that the composition within tubing 10 may be applied to the wafer. Base 6 preferably substantially surrounds track 4. Base 6 is adapted to move along track 4 and may be driven by a cam or similar device powered by electrically-activated motor 8.

Figure 2:
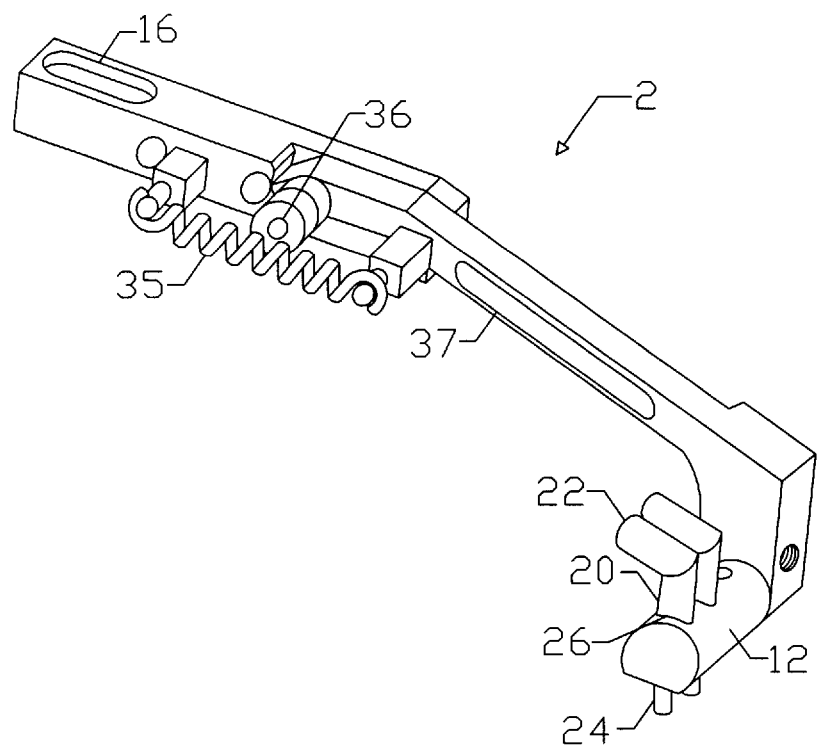
FIG. 2 depicts an embodiment of a dispense arm and nozzles.

An embodiment of arm 2 is shown in FIG. 2. The receiver 12 preferably has at least one aperture that is adapted to receive a nozzle 20 for dispensing photoresist solution. The receiver may contain two apertures as shown in FIG. 2 when it is desired to dispense two different photoresist solutions to a semiconductor wafer. Nozzle 20 has a receiving end 22 and a dispensing end 24. Receiving end 22 is preferably adapted to form a connection with tubing 10 such that composition may be transferred from a photoresist source 1, through tubing 10, and then from nozzle 20 to a wafer. Nozzle 20 may contain a threaded portion on the interior surface of the nozzle in the vicinity of receiving end 22. The threads of the threaded portion preferably engage the outer surface of tubing 10 when the tubing is positioned within the receiving end of the nozzle. The nozzle may contain a circumferential protrusion 29 (see FIG. 4) on its interior surface to maintain a substantially liquid tight seal between tubing 10 and nozzle 20. In an embodiment, the circumferential protrusion 29 causes a reduction in the internal diameter of nozzle 20 at a location between the threaded portion of the nozzle and dispensing end 24. Arm 2 may include envelop 37 through which tubing 10 passes. In an embodiment, tubing 10 is frictionally engaged within envelop 37 to maintain the tubing in a fixed position during the dispense process.

In an embodiment, the chuck is mounted on a spindle to allow the wafer to be spun as the dispense system applies a photoresist solution to the wafer. The wafer may be secured to the chuck using a vacuum system. Such systems are well known to those skilled in the art. Arm 2 preferably moves along track 4 as it dispenses photoresist solution to the wafer. The photoresist solution may be applied by first positioning receiver 12 over an outer edge of the wafer and dispensing photoresist solution onto the edges of the wafer as the wafer spins. The base 6 may be moved along track 4 such that receiver 12 moves to a position directly above the center of the wafer while photoresist solution is being applied onto the wafer. In this manner, the nozzle moves in a straight line above the wafer from an edge of the wafer to the center of the wafer while dispensing photoresist solution onto the wafer. Photoresist solution is applied to substantially the entire exposed surface of the wafer due to the rapid spinning of the wafer. Alternatively, receiver 12 may move from a position directly over the center of the wafer to a position directly above an edge of the wafer as photoresist solution is dispensed to the wafer.

In an embodiment, the wafer is spinning between about 900 revolutions per minute and about 1800 revolutions per minute as the photoresist solution is applied to the wafer. It is preferred that between about 1 second and about 5 seconds elapse during the movement of nozzle 20 from an initial position over the edge of the wafer to a final position over the center of the wafer (or alternatively from the position over the center to the position over the edge). The nozzle preferably remains above the center of the wafer for a time period of between about 1 second and about 5 seconds while photoresist solution is continuously dispensed onto the wafer.

In an embodiment, nozzle 20 has a substantially circular cross-section and the receiving end 22 has a diameter greater than the diameter of dispensing end 24. Nozzle 20 preferably has a circular cross-section, however, it is to be understood that the nozzle may have various other cross-sectional geometries. In an embodiment, the diameter at the outlet of dispensing end 24 is less than about ¼ of an inch, more preferably less than about ⅛ of an inch, and more preferably still about ¹⁄₁₆ of an inch. The reduced diameter of the nozzle may allow for a more even distribution of photoresist to the wafer than is typically achieved when the photoresist solution is dispensed directly from tubing having a larger diameter. The use of nozzle 20 also may allow a reduction in the volume of photoresist solution expended to achieve a coating with a selected thickness. For instance, in an embodiment in which photoresist is dispensed directly from two sections of tubing each having a ¼ inch diameter to a wafer having a diameter of 6 inches, a volume of about 4 ml of photoresist is expected to achieve a coating thickness of about 12,300 angstroms in a time period of 21 seconds. In a similar embodiment in which the photoresist is dispensed from a pair of nozzles each having a ¹⁄₁₆ inch diameter to a wafer having a diameter of 6 inches, only 2.5 ml of photoresist is anticipated to achieve a coating thickness of about 12,300 angstroms in a time period of 21 seconds. Nozzle 20 may serve to restrict the flow of the composition passing through it. The pressure of a photoresist solution may be reduced between approximately 1 psi and 20 psi as the composition travels through nozzle 20. In an embodiment, the photoresist solution is atomized as it passes from nozzle 20.

In an embodiment, aperture 18 in receiver 12 is circular and has a diameter greater than the diameter of the dispensing end 24 of nozzle 20 and less than the diameter of receiving end 22 of the nozzle. Nozzle 20 preferably has a ridge 26 or protrusion between the receiving end 22 and the dispensing end 24. The ridge 26 or protrusion is preferably wider than aperture 18 such that the ridge engages the top surface 33 of receiver 12 when nozzle 20 is positioned within aperture 18. In this manner, ridge 26 may prevent the portion of the nozzle between the ridge and receiving end 22 from passing into aperture 18. Thus the location of the ridge may determine the distance between the outlet 31 of dispensing end 24 and the wafer.

The distance between the outlet 31 of dispensing end 24 and the wafer is significant since coating defects tend to result if outlet 31 is too close or far from the wafer. If the outlet of dispensing end 24 is too far from the wafer, splashing effects may occur and an uneven coat may result. In addition, if the outlet of dispensing end 24 does not extend below the bottom surface 44 of receiver 12, the receiver may interfere with the spray distribution from nozzle 22, film may accumulate on the bottom surface 44 of the receiver, and/or contaminant particles from the bottom surface 44 of receiver 12 may be dispersed onto the wafer. If the outlet of dispensing end 24 is too close to the wafer, an uneven coating tends to result. The distance from the outlet of the dispensing end to the wafer is preferably between about ¹⁄₁₆ of an inch and about ⅛ of an inch.

In practice, operators may need to remove nozzle 20 from receiver 12 to monitor the dispense of photoresist. Ridge 26 facilitates the positioning of nozzle 20 into receiver 12, allowing the outlet of dispensing end 24 to be maintained at a selected distance from the wafer. In the absence of ridge 26, outlet 31 may be incorrectly positioned below bottom surface 44 at a distance other than the desired distance. Ridge 26 enables an operator to insert nozzle 20 into aperture 18 of the receiver 12 until ridge 26 engages the to surface 33 of the receiver, thereby inhibiting the nozzle from being inserted further into the aperture and maintaining outlet 31 at a desired distance from a wafer.

Figure 3:
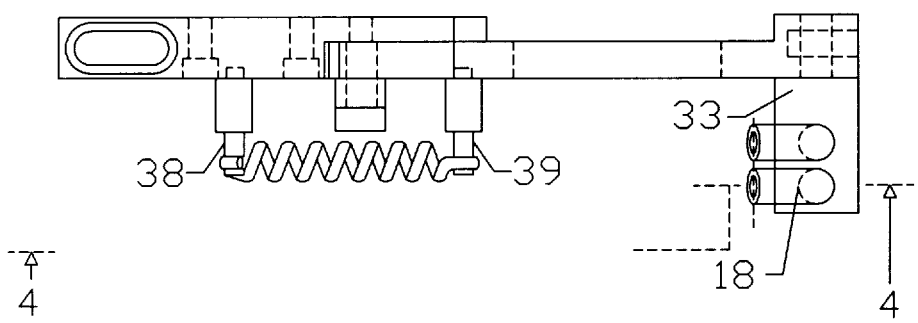
FIG. 3 depicts a top view of an embodiment of a dispense arm.
Figure 4:
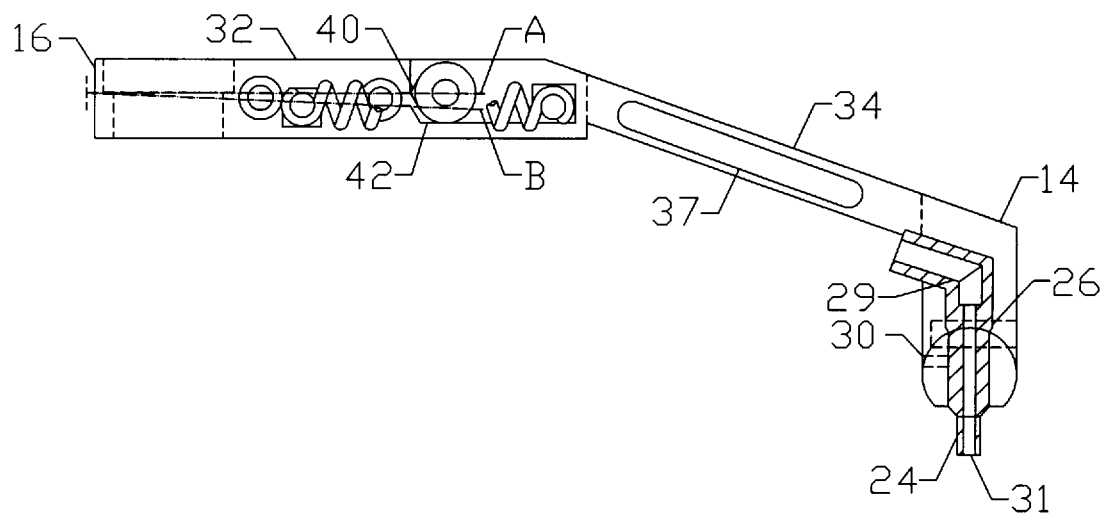
FIG. 4 illustrates an embodiment of a dispense arm in a pivoted position.

Top and side views of arm 2 are shown in FIGS. 3 and 4, respectively. In an embodiment, receiver 12 contains at least one opening 30 adapted to receive a connector to fixably attach nozzle 20 within aperture 18. Opening 30 is preferably adapted to receive a set screw that frictionally engages an outer surface of nozzle 20 to maintain it in a fixed position relative to receiver 12.

Figure 5:
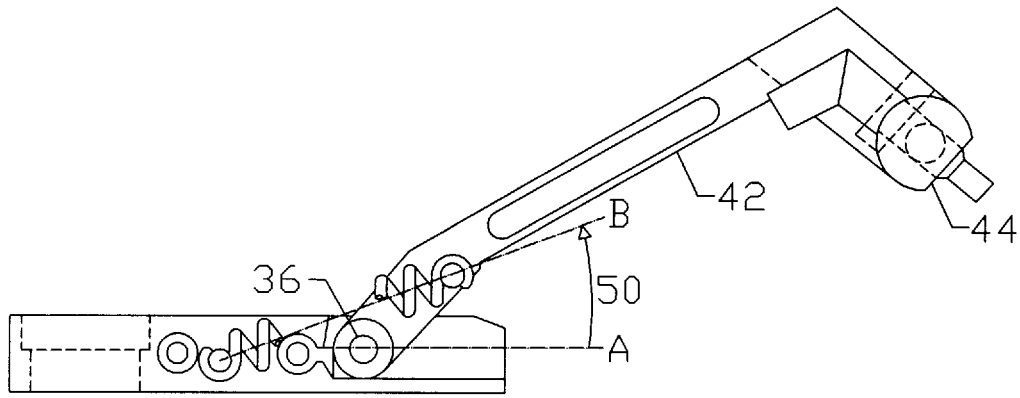
FIG. 5 depicts a side view of an embodiment of a dispense arm.

In an embodiment, arm 2 includes frontal member 32 and distal member 34. Frontal member 32 and distal member 34 may be connected by connector 36, which is preferably a screw. It is preferred that frontal member 32 and distal member 34 are pivotally engaged such that distal member 34 may pivot in relation to frontal member 32 along a substantially vertical axis. As shown in FIG. 5, distal member 34 preferably pivots to a degree such that an upward angle (i.e., an angle opening away from the wafer) is formed between frontal member 32 and distal member 34 with a vertex in the vicinity of connector 36. Distal member 34 preferably pivots to an extent such that receiver 12 may reach an elevation greater than that of frontal end 16 when arm 2 is connected to base 6 as shown in FIG. 1. Distal member 34 may have stopper 40 which is configured to engage indented surface 42 of frontal member 32 to inhibit the pivoting of the distal member beyond a desired position.

During spin coating processes, composition tends to be sprayed onto arm 2 due to the rapid spinning of the wafer in the chuck below. The resulting film that may develop on arm 2 (particularly on the bottom surface of the receiver) tends to collect contaminants (e.g., dirt). Such contaminants may be transferred to the wafer during the coating process. It is therefore necessary to periodically clean arm 2. The pivoting of distal member 34 relative to frontal member 32 facilitates the cleaning of arm 2. Pivoting distal member 34 upwards may expose the bottom surface 44 of receiver 12 and the underside 42 of arm 2 (i.e., the portion of the arm that faces the wafer while the photoresist solution is applied) to allow these portions to be cleaned without altering the position of the chuck below the arm. In the absence of a pivotal engagement between frontal member 32 and distal member 34, the chuck that contains the wafer below receiver 12 may have to be lowered before underside 42 of arm 2 and bottom surface 44 can be cleaned.

In an embodiment, arm 2, receiver 12, and nozzle 20 are constructed of 316 L stainless steel. Arm 2, receiver 12, and nozzle 20 are preferably electropolished so that they have a surface finish roughness of less than about 35 microinches (rms), as measured by the root mean square roughness scale. Electropolishing these dispense system components tends to make their surfaces more resistant to particle and film accumulation. The increased smoothness of the surface finish also tends to make the removal of such contaminants easier. The electropolishing process is well known to those skilled in the art.

In an embodiment, frontal member 32 contains a protrusion or pin 38 and distal member 34 contains a protrusion or pin 39, and a spring 35 extends from pin 38 to pin 39. The distance between pins 38 and 39 when distal member 34 is in a "pivoted position" (i.e., the configuration illustrated in FIG. 5) is preferably less than that when the distal member is in the "dispensing position" illustrated in FIG. 4. Thus, spring 35 is preferably stretched as distal member 34 is moved from the pivoted position to the dispensing position. In this manner, the spring tension will tend to maintain distal member 34 in the pivoted position unless the arm is manually moved into the dispensing position. When distal member 34 is in the dispensing position, spring 35 preferably is substantially parallel to frontal member 32 so as not to pull the distal member into the pivoted position. An angle 50 is formed between the axis A which runs through connector 36 substantially parallel to frontal member 32 and axis B which runs along the length of spring 35. It is preferred that angle 50 is between about 20° and about 70° when distal member 34 is in the pivoted position.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements, materials, and compositions may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An apparatus adapted to dispense a composition onto a wafer, comprising:
   an arm comprising a frontal end and a distal end;
   a receiver having a top surface and a bottom surface, the receiver connected to the arm proximate the distal end of the arm, the receiver comprising an aperture extending from the top surface of the receiver to the bottom surface of the receiver; and
   a nozzle comprising a receiving end and a dispensing end having an outlet, the nozzle being engaged within the receiver such that the dispensing end extends through the aperture of the receiver, the outlet of the dispensing end extends beyond the bottom surface of the receiver, and the receiving end is located above the top surface of the receiver.

2. The apparatus of claim 1 wherein the receiving end, dispensing end, and aperture of the receiver each have a diameter, and wherein the diameter of the aperture is greater than the diameter of the dispensing end and less than the diameter of the receiving end.

3. The apparatus of claim 1 wherein the nozzle further comprises a ridge between the receiving end and the dispensing end, and wherein the ridge engages a top surface of the receiver.

4. The apparatus of claim 1 wherein the receiver comprises an additional aperture adapted to receive a nozzle.

5. The apparatus of claim 1, further comprising a photoresist source and tubing, the tubing being connected to the receiving end of the nozzle and adapted to supply photoresist from the photoresist source to the receiving end of the nozzle.

6. The apparatus of claim 1 wherein the arm further comprises a frontal member and a distal member, and wherein the distal member is pivotally engaged with the frontal member such that the distal member is adapted to move relative to the frontal member along a substantially vertical axis.

7. The apparatus of claim 6 wherein the distal member further comprises a protrusion and the frontal member further comprises a protrusion, and further comprising a spring extending from the protrusion of the frontal member to the protrusion of the distal member.

8. The apparatus of claim 6, further comprising an envelop within the frontal member, the envelop adapted to substantially surround a portion of tubing.

9. The apparatus of claim 5, further comprising an envelop within the arm, and wherein the tubing passes through the envelop and a portion of the tubing is fixably secured within the envelop.

10. The apparatus of claim 1 wherein the outlet of the dispensing end of the nozzle has a diameter less than about 1/8 of an inch.

11. The apparatus of claim 1 wherein the nozzle is adapted to reduce the pressure of a composition by an amount between about 1 psi and about 20 psi as the composition passes through the nozzle.

12. The apparatus of claim 5 wherein the tubing comprises teflon and the receiving end of the nozzle forms a substantially liquid-tight seal with the tubing.

13. The apparatus of claim 1 wherein the receiver further comprises a connector that fixably engages the nozzle within the aperture of the receiver.

14. The apparatus of claim 1 wherein the arm and the receiver are electropolished.

15. The apparatus of claim 14 wherein the receiver and the arm each have a surface finish that is smoother than about 35 rms.

16. An apparatus adapted to dispense a photoresist solution onto a wafer, comprising:

a track having a length;

an arm comprising a frontal end and a distal end;

a base connecting the arm and the track, the base adapted to move along the length of the track;

a receiver having a top surface and a bottom surface, the receiver connected to the arm proximate the distal end of the arm, the receiver comprising an aperture that extends from the top surface of the receiver to the bottom surface of the receiver;

a nozzle comprising a receiving end and a dispensing end having an outlet, the nozzle being engaged within the receiver such that the dispensing end extends through the aperture of the receiver, the outlet of the dispensing end extends beyond the bottom surface of the receiver, and the receiving end is located above the top surface of the receiver;

a source of photoresist solution; and tubing adapted to carry photoresist solution from the source of photoresist solution to the receiving end of the nozzle.

17. A dispense arm for dispensing a photoresist solution onto a wafer, comprising:

a frontal member;

a distal member;

a connector pivotally connecting the frontal member and the distal member;

a receiver having a top surface and a bottom surface, the receiver connected to the distal member, the receiver comprising an aperture extending from the top surface of the receiver to the bottom surface of the receiver; and a nozzle comprising a receiving end and a dispensing end, the nozzle being engaged within the receiver such that the dispensing end extends through the aperture of the receiver, at least a portion of the dispensing end extends beyond the bottom surface of the receiver, and the receiving end is located above the top surface of the receiver.

18. The dispense arm of claim 17 wherein the frontal member further comprises a protrusion and the distal member further comprises a protrusion, and further comprising a spring extending from the protrusion of the frontal member to the protrusion of the distal member, and wherein the spring stretches as the distal member pivots relative to the frontal member.

* * * * *